United States Patent
Tatsumi et al.

[19]

[11] Patent Number: 5,886,906
[45] Date of Patent: Mar. 23, 1999

[54] METHOD AND APPARATUS OF SIMULATING SEMICONDUCTOR CIRCUIT

[75] Inventors: Takaaki Tatsumi; Koichi Hayakawa, both of Kanagawa, Japan

[73] Assignee: Sony Corporation, Japan

[21] Appl. No.: 768,400

[22] Filed: Dec. 18, 1996

[30] Foreign Application Priority Data

Dec. 20, 1995 [JP] Japan .................................. 7-331641

[51] Int. Cl.$^6$ ...................................................... G06F 17/50
[52] U.S. Cl. ............................................ 364/578; 364/488
[58] Field of Search ................................ 364/578, 488, 364/468.16; 395/500

[56] References Cited

U.S. PATENT DOCUMENTS

| | | | |
|---|---|---|---|
| 5,301,118 | 4/1994 | Heck et al. ........................ | 364/468.16 |
| 5,481,485 | 1/1996 | Takeuchi ............................... | 364/578 |
| 5,627,772 | 5/1997 | Sonoda et al. ........................ | 364/578 |
| 5,655,110 | 8/1997 | Krivokapic et al. ................. | 395/500 |
| 5,719,796 | 2/1998 | Chen ...................................... | 364/578 |

*Primary Examiner*—Vincent N. Trans
*Attorney, Agent, or Firm*—Ronald P. Kananen; Rader, Fishman & Grauer

[57] ABSTRACT

A simulation apparatus for simulating a characteristic of a semiconductor circuit, including; a distribution information input unit for receiving a distribution information, the distribution information including a range and/or profile of distribution of a variation of a device parameter and/or a process parameter of the semiconductor circuit and being adaptive to an actual distribution; a random number generating unit for generating a random number on the basis of a probability responsive to the received distribution information; a characteristic calculation unit for calculating a dominant formula by using the random number to obtain a characteristic of the semiconductor circuit; and an output unit for outputting the resultant characteristic of the semiconductor circuit.

12 Claims, 9 Drawing Sheets

METHOD AND APPARATUS OF SIMULATING SEMICONDUCTOR CIRCUIT

BACKGROUND OF INVENTION

1. Field of the Invention

The present invention relates to a method of simulating a semiconductor circuit such as a transistor, an apparatus performing the method, and a recording medium storing a program performing the simulation method.

More particularly, the present invention relates to a method of simulating a semiconductor circuit which can effectively perform the simulation by a Monte Carlo method, even if the distribution of the semiconductor circuit's device parameters or the semiconductor circuit's process parameters, which affect the characteristics of the semiconductor circuit, is not a normal distribution, an apparatus thereof and a recording medium storing the method.

Also, more particularly, the present invention relates to a method of simulating a semiconductor circuit that can have a shortened processing time even if the number of parameters used for simulating the characteristics of the semiconductor circuit is large, an apparatus thereof, and a recording medium storing the method.

2. Description of the Related Art

During the development and design of the semiconductor circuit such as a transistor, the simulation of a semiconductor circuit is important for estimation (prediction) of the deviation of the device characteristics such as the deviation of a threshold voltage $V_{th}$, analysis of the characteristics and understanding of the distribution of the electric field in the semiconductor circuit. In the simulation, process control parameters and profile dimensions such as a gate length are varied on the basis of the deviation of the production processes.

When process parameters are assumed to be in a normal distribution, the prediction of the deviation of the device characteristics uses a Monte Carlo method. As such, simulation software for a semiconductor circuit, PDFAB by PDF Solution Inc. and VMFab by SILVACO are on sale and have been extensively used. Such simulation software are limited to use when the deviation of the semiconductor circuit's characteristics is a normal distribution. In actual production processes, the deviation of the semiconductor circuit characteristics is not subjected to a normal distribution. Therefore, such known simulation software suffers from the disadvantage of an inaccurate simulation.

In addition to the above disadvantage, such known simulation software suffers from the disadvantage of a long processing (simulation) time. In such simulation software, when the number of the deviations, is n, $10^n$ of the repeat (iteration) of the simulation is required, and thus if the number of the deviations is increased the simulation time will be very long. For example, when the characteristic calculation of 100 times for one deviation is carried out, and the number of the deviations is three, the loop calculation of one million times is needed, and the calculation time is over 100 hours.

To shorten the simulation time, the calculation number for each parameter should be reduced; however, such known simulation software can not greatly shorten the simulation time, and suffers from the disadvantage of inaccuracy in the simulation results.

SUMMARY OF THE INVENTION

An object of the present invention is to provide a simulation apparatus, a simulation method and a recording medium storing the same, enabling a variety of distribution function or distribution information to improve the accuracy of the simulation.

Another object of the present invention is to provide a simulation apparatus, a simulation method and a recording medium storing the same, that can shorten the simulation time while keeping the accuracy of the simulation.

According to the present invention, there is provided a simulation apparatus for simulating a characteristic of a semiconductor circuit, comprising; a distribution information input means for receiving distribution information, the distribution information including a range and/or profile of distribution of a variation of a device parameter and/or a process parameter of the semiconductor circuit and being adaptive to an actual distribution; a random number generating means for generating a random number on the basis of a probability responsive to the received distribution information; a characteristic calculation means for calculating a dominant formula by using the random number to obtain a characteristic of the semiconductor circuit; and an output means for outputting the resultant characteristic of the semiconductor circuit.

Preferably, the distribution information comprises a distribution of which the profile is a normal Gaussian distribution and/or a non-Gaussian distribution.

Preferably, the distribution of the distribution information is expressed by a numerical data series or a histogram.

Preferably, the simulation apparatus comprises a digital computer.

According to the present invention, there is also provided a method of simulating a characteristic of a semiconductor circuit, which includes the steps of; receiving distribution information, the distribution information including a range and/or profile of distribution of a variation of a device parameter and/or a process parameter of the semiconductor circuit and being adaptive to an actual distribution; generating a random number on the basis of a probability responsive to the received distribution information; calculating a dominant formula by using the random number to obtain a characteristic of the semiconductor circuit; and outputting the resultant characteristic of the semiconductor circuit.

Preferably, the distribution information comprises a distribution of which the profile is a normal Gaussian distribution and/or a non-Gaussian distribution.

Preferably, the distribution information is expressed by a numerical data series or a histogram.

Preferably, the generating of the random number is carried out by a Monte Carlo method.

According to the present invention, there is also provided a recording medium storing software for performing the method in a digital computer.

According to the present invention, there is provided a simulation apparatus for simulating a characteristic of a semiconductor circuit, comprising; a distribution information input means for receiving a distribution information, the distribution information including a profile, center and deviance of a distribution of a variation of a parameter of the semiconductor circuit which comprises a device parameter and/or process parameter, a sampling means for sampling two points for each parameter, the two points being a center point of the distribution and a point on the profile and apart from the center point by a distance defined by a predetermined distribution ratio, or two points on the profile, at both sides of the center point, and apart from the center point by distances defined by a predetermined distribution ratio; a characteristic calculation means for calculating a dominant formula of the semiconductor circuit at the two sampled points to obtain two characteristics of the semiconductor circuit at the two points; a distribution approximation term calculation means for calculating an approximation term which is derived by developing a formula expressing the characteristic of the semiconductor circuit for micro portions and expressed as an average of powers; a distribution characteristic calculation means for calculating a variance and/or standard deviation of the characteristic of the semiconductor circuit for the full range of the parameter, by using the calculated approximation term; and an output means for outputting the result of the distribution characteristic calculation.

According to the present invention, there is provided a method for simulating a characteristic of a semiconductor circuit, which includes the steps of: receiving distribution information, the distribution information including a profile, center and deviance of a distribution of a variation of a parameter of the semiconductor circuit which comprises a device parameter and/or process parameter; sampling two points for each parameter, the two points being determined a center point of the distribution and a point on the profile and apart from the center point by a distance defined by a predetermined distribution ratio, or two points on profile, at the both sides of the center point, and apart from the center point by distances defined by a predetermined distribution ratio; calculating a dominant formula of the semiconductor circuit at the two sampled points to obtain two characteristics of the semiconductor circuit at the two points; calculating an approximation term which is derived by developing a formula expressing the characteristic of the semiconductor circuit for micro portions and expressed as an average of powers; calculating a variance and/or standard deviation of the characteristic of the semiconductor circuit for the full range of the parameter, by using the calculated approximation term; and outputting the result of the distribution characteristic calculation.

According to the present invention, there is also provided a recording medium storing software for performing the above method in a digital computer.

BRIEF DESCRIPTION OF THE DRAWINGS

The above and other objects and features of the present invention will be more apparent in detail with reference to the accompanying drawings, in which.

DESCRIPTION OF THE PREFERRED EMBODIMENTS

FIRST EMBODIMENT

A first embodiment of the present invention will be described.

In the first embodiment, a Monte Carlo method is applied to vary the conditions of a simulation of a semiconductor circuit. Namely, in the embodiment, a predetermined parameter(s) among a variety of process parameters and/or device parameters of a semiconductor circuit is varied according to a predetermined rule and other parameter(s) are fixed, predetermined domination (subjection) formulas expressing the characteristics of the semiconductor circuit are calculated, consequently, the deviations of the characteristics of the semiconductor circuit due to the variation of the parameter(s) can be predicted (estimated) in a statistical manner.

In this specification, the semiconductor circuit involves a transistor, a diode, a capacitance element, a resistance element, an inverter, a memory cell, a variety of memories, and other circuits.

The simulation method of the embodiment of the present invention can be employed for a variety of the characteristics of semiconductor circuits such that micro phenomena of the semiconductor circuit can be expressed by physical formulas. As the simulation of such a semiconductor circuit, the simulation of the characteristics of an active device is typical. For example, the prediction or analysis of a threshold voltage $V_{th}$ of a transistor, a mutual conductance gm of the transistor, and a drive current Id of the transistor can be carried out. Also, the simulation method of the embodiment can be applied to understand the electric field condition and the distribution of impurities injected to a substrate of the semiconductor circuit. For the parameters affecting the characteristics of the semiconductor circuit, for example, with respect to the threshold voltage $V_{th}$ of a MOS transistor, there is a known dose, quantity and energy for an injection of ions for controlling Vth, a gate oxide film thickness, a gate length, etc.

In the present embodiment, to vary the parameters in a predetermined rule, a normal distribution and a general function expressing distributions other than the normal distribution (hereinafter, "a general distribution function") can be used, and further actual measurement data can also be used.

In the simulation using a Monte Carlo method, a loop (repeat) progressive calculation for analyzing a semiconductor circuit is performed, the distribution information of the parameters must be inserted into a loop (routine) of the characteristic calculation. In the embodiment, the distribution information of the parameters is given as random numbers generated in response to a probability defined by the distribution information, and a frequency which can be an input of a numerical calculation is determined by the random numbers.

Figure 1:
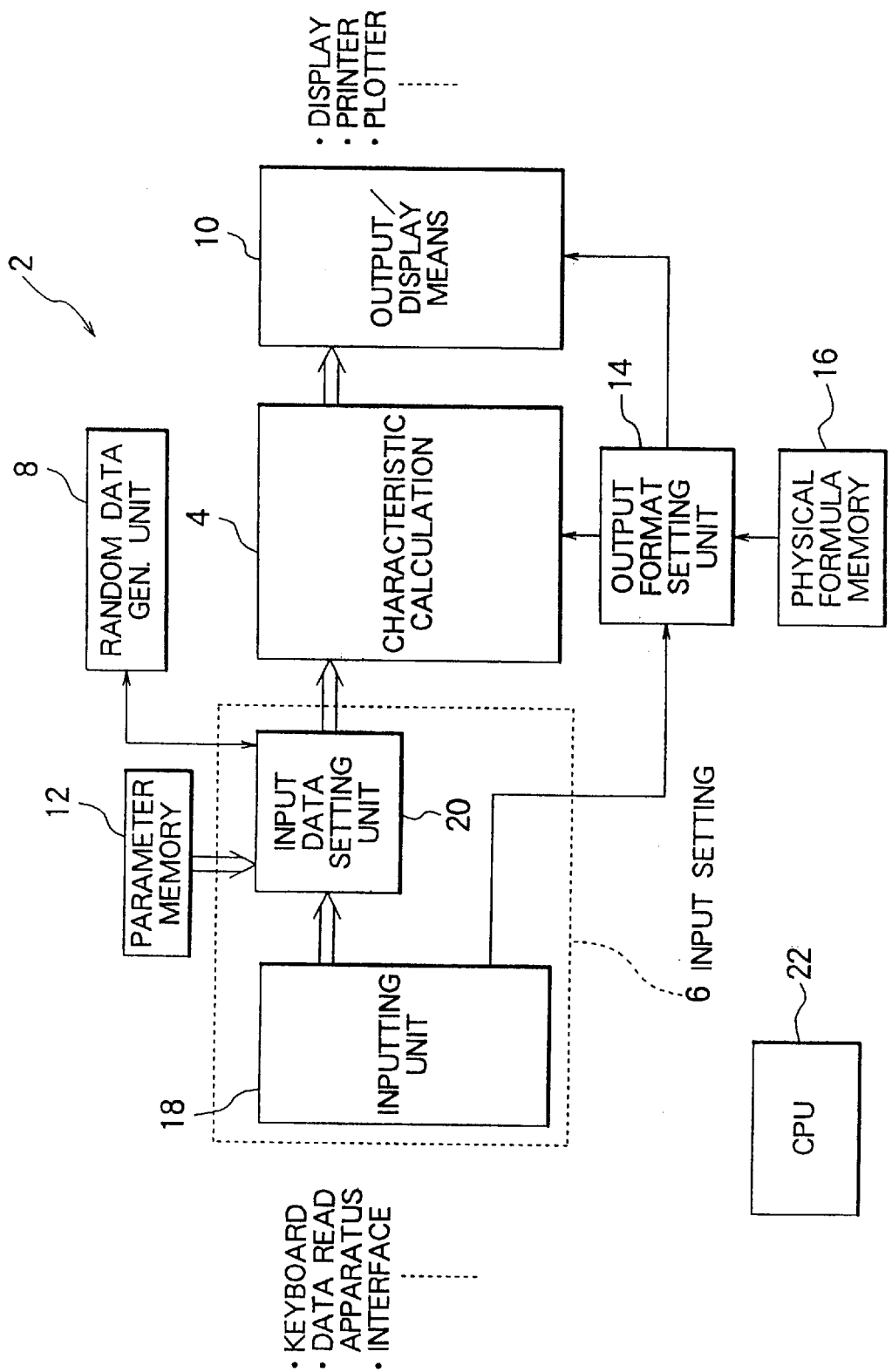
FIG. 1 is a block diagram of a simulator apparatus of a first embodiment in accordance with the present invention.

FIG. 1 is block diagram of a simulation apparatus of the first embodiment of the present invention.

In the simulation apparatus 2 (simulator 2) of the embodiment, an actual distribution of the parameters can be input by any one of various forms, e.g. a general distribution function, a numeral data series, a histogram, etc.

As shown in FIG. 1, the simulator 2 is configured by a characteristic calculation unit (means) 4, an input setting unit (means) 6, a random data generation unit (means) 8, and an output display unit (means) 10, and a parameter memory 12.

The input setting unit 6 is connected to the parameter memory 12. The parameter memory 12 previously stores a plurality of patterns of general distribution functions for the respective parameters and set values of the parameters, the set values indicating centers of deviations and being called fixed parameters. To switch the output and display unit 10, the output setting unit 14 is provided between the input setting unit 8 and the output and display unit 10. Further, a physical formula memory 16 storing predetermined dominant formulas of a physical device, used for the calculation, can be connected to the characteristic calculation unit (means) 14 through the output setting unit 14.

A central processing unit (CPU) 22 monitors and controls the operations of the input setting unit 6, the random number generation unit 8, the output and display unit 10, the parameter memory 12, the output setting unit 14 and the physical formula memory 16. When the simulator 2 inputs only measurement values, the parameter memory 12 and the physical formula memory 16 are commonly used by another memory, or the parameter memory 12 and the physical formula memory 16 can be omitted. When the operation of the output and display unit 10 and output formats thereof are previously determined, the output data setting unit 14 can also be omitted.

The input setting unit 6 comprises an input unit 18 and an input data setting unit 20. The input unit 18 comprises a key input unit, a data read unit for reading measurement data stored in a recording medium upon request, and an interface unit for reading actual measurement data from a measurement apparatus provided at an outside of the simulator 2 in an on-line mode. The input data setting unit 20 performs an initial input parameter setting for the simulator 2, and adds frequency information from the random number generation unit 8 to the general distribution function from the parameter memory 12 or the measurement data input from an external apparatus (not shown) through the input unit 16 to automatically set the input data to the characteristic calculation unit 4.

The random number generation unit 8 generates random numbers which are defined by a probability in response to a predetermined general distribution function or a histogram.

The output and display unit 10 is configured by, for example, a display unit (TV monitor), a printer and a plotter, or other output device. When the output and display unit 10 comprises a plurality of equipment, the switching of the equipment can be done by the output setting unit 14 in response to operational instructions from the input unit 16.

Figure 2:
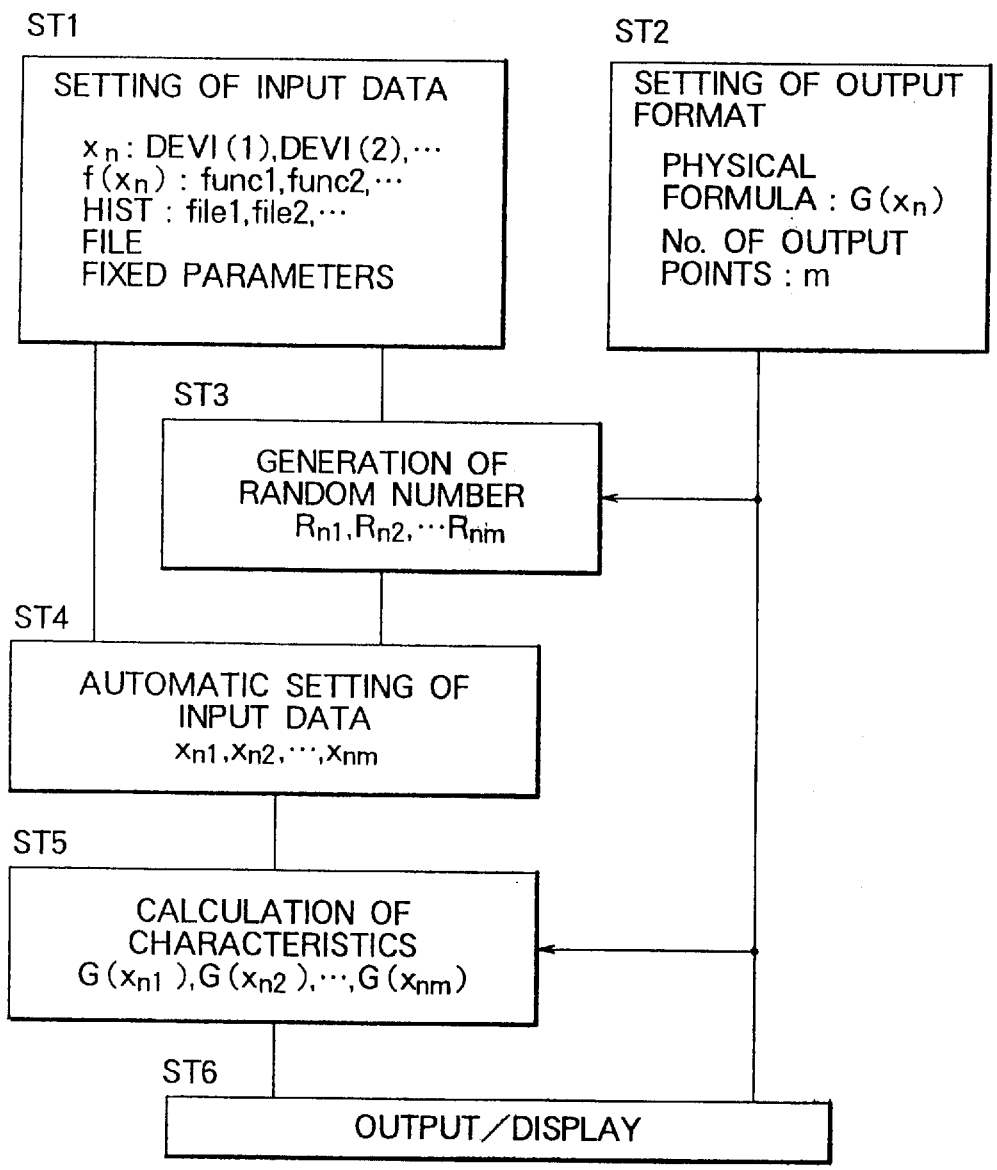
FIG. 2 is a flow chart of a simulation method operating in the simulation apparatus of FIG. 1.

The operation of the simulator 2 will be described with reference to FIG. 2. FIG. 2 is a flow chart showing the simulation method of the embodiment of the present invention.

STEP 1 (ST1)

An initial input setting is carried out. The initial input setting is mainly carried out by the input data setting unit 20.

The setting is carried out by selecting a distribution parameter(s) $X_n$ to be varied among a variety of parameters, mutually manual inputting a fixed parameter(s) for other parameters(s), or reading a fixed parameter(s) for other parameter(s) from the parameter memory 12. The input of the distribution parameter $X_n$ is carried out by reading a predetermined distribution function from the parameter memory 12 or the data reading apparatus as the input unit 18 when the distribution parameter $X_n$ is given by a function. Alternatively, when the distribution information is given by a measurement data, for example, a numerical data series or a histogram, the distribution information can be directly read by the input unit 18 as the data reading apparatus or an external measurement apparatus through the input unit 18 as the interface.

STEP 2 (ST2)

At the same time of the operation of STEP 1, the initial output setting is carried out by the output setting unit 14.

The device characteristics, which are objects for the characteristic calculation, are selected in accordance with the operational instructions from the input unit 18, and a physical formula(s) $G(X_n)$ which defines (dominates) the device characteristics is read from the physical memory 16.

The output from the results of the characteristics calculation is set in accordance with the operational instructions by the input unit 18. For example, the number m of the output points is set, and either a table or graph format is determined.

The switching of the output and display unit 10 is performed.

STEP 3 (ST3)

The random number is generated by the random number generation unit 8. Namely, with respect to the respective distribution parameters $X_n$ where n=1,2, . . . , a plurality (m) of output points of the random numbers $R_{n1}$, $R_{n2}$, . . . , $R_{ni}$, . . . , $R_{nm}$ are generated.

The generation of the random numbers when the distribution information is given as the distribution function $f(X_n)$ will be described more in detail.

First, the maximum value $X_n(max)$ and the minimum value $X_n(min)$ for the distribution parameters $X_n$ are determined. The maximum value $X_n(max)$ is defined as a, and the minimum value $X_n(min)$ is defined as b. These values a and b indicate that the process parameters can be varied in the range [a,b] in accordance with the distribution function $f(X_n)$.

The uniform random number, of which a value lies between 0 to 1, namely in the range [0,1] and is named as r, is generated. The random number $R_{ni}$, where i=1,2, . . . , m, of i-th output point is generated to satisfy the following formula 1.

$$\frac{\int_a^{R_{ni}} f(x)dx}{A} = r \tag{1}$$

The random numbers $R_{ni}$ which satisfy the above formula (1) are calculated for the respective output points, to obtain the random numbers $R_{n1}$, $R_{n2}$, . . . , $R_{ni}$, . . . , $R_{nm}$, and the generation of the random numbers is terminated.

Note, the whole random numbers $R_{n1}$, $R_{n2}$, . . . , $R_{ni}$, . . . , $R_{nm}$ for the m piece of the output points, obtained by the above formula (1), are varied at random in accordance with the distribution function $f(X_n)$.

STEP 4 (ST4)

The input data setting to the m-piece of characteristic calculation is carried out by sequentially using the random numbers $R_{n1}$, $R_{n2}$, . . . , $R_{ni}$, . . . , $R_{nm}$ for the m-piece of the output points. The input data setting is carried out by the input data setting unit 20 shown in FIG. 1.

Specifically, as the input of the characteristic calculation, first, the distribution parameters $x_{n1}$, which are varied by a predetermined value to a center value, are set by using the first random numbers $R_{n1}$. Similarly, by using the second random numbers $R_{n2}$ the next distribution parameters $x_{n2}$ are set. This processing will be performed for subsequent distribution parameters, and the distribution parameters $x_{ni}$, $x_{n2}$, ..., $x_{ni}$, ..., $x_{nm}$ varied in accordance with the distribution function $f(X_n)$ are automatically set.

STEP 5 (ST5)

The distribution parameters $x_{ni}$, $x_{n2}$, ..., $x_{ni}$, ..., $x_{nm}$ are input to the physical formula $G(X_n)$ set at STEP 2, and the characteristic calculation is performed.

When the semiconductor circuit is a transistor, as typical physical formulas $G(X_n)$ which defines (dominates) the physical characteristic of the transistor, characteristic formulas derived from the following formulas 2 to 4 can be employed. Formula 2 indicates Poisson's equation, formula 3 indicates the electron-current continuous equation, and formula 4 indicates the positive hole-current continuous equation.

$$\nabla(\epsilon \nabla \Phi) = q(n-p-C) \quad (2)$$

$$-\nabla \cdot J_n + qR = 0 \quad (3)$$

$$-\nabla \cdot J_p - qR = 0 \quad (4)$$

where, $\epsilon$ is a permitivity of silicon, etc,

Φ is an electrostatic potential, q is a unit charge, n is a concentration of electrons, p is a concentration of positive holes, C is a difference between a concentration ND of impurity injected into an n-type substrate and a concentration NA of impurity injected into a p-type substrate, C=ND−NA $J_n$ is a density of an electron-current, $J_p$ is a density of a positive hole current, and R is a concentration of electrons and positive holes which is generated and become extinct for a unit time.

STEP 6 (ST6)

The results of the characteristic calculation are displayed or output in accordance with the output format determined at STEP 2, and the simulation is terminated.

More specific examples of the embodiment will be described.

EXAMPLE 1

Example 1 is a simulation example of a threshold voltage where the dose quantity at the ion injection is varied at random, as one example of the distribution information of the distribution parameters is given as the general distribution function.

Table 1 is an example of the output formats of the parameters displayed or output on the display unit, such as a TV monitor, as the output and display unit 10 at the initial input setting shown in FIG. 2.

TABLE 1

...
IMPL DOPANT = BORON, DOSE = 5E13, ENERGY = 30keV,
DEVI = DOSE, FUNC = func1
...

Here, in accordance with the information of "DOPANT=BORON, DOSE=5E13, and ENERGY=30 KeV", a grade of ion for an ion injection, the dose quantity and the energy level are set. In accordance with "DEVI=DOSE", only the dose quantity is varied. "FUNC=func1" designates the variation of the parameters in accordance with the function 1 (func1).

Figure 3A:
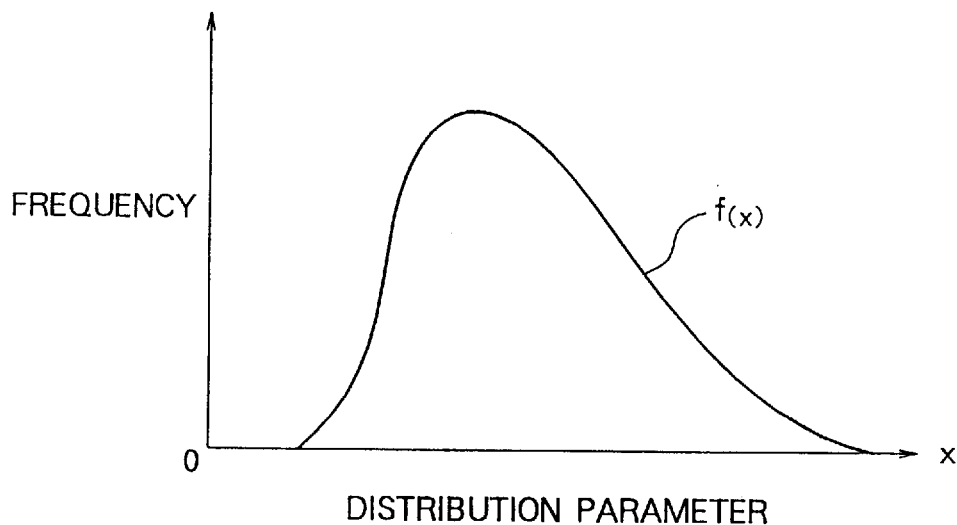
FIGS. 3A and 3B are graphs of distribution profile curves applied to the simulation method of FIG. 2.

FIG. 3A is a graph illustrating function 1. The function 1 is not limited to that of FIG. 3A, and can be any profile in accordance with the distribution of the distribution parameter, i.e. the dose quantity in example 1. In the embodiment of the present invention, any suitable distribution function can be adapted, therefore, the simulation of the Monte Carlo method can be achieved by using actual distribution patterns or a distribution pattern close to the actual distribution pattern.

At STEP 2, the output setting unit 14 reads the formula $V_{th}(X_n)$ of the threshold as the physical formula $G(X_n)$ from the physical formula memory 16, and applies the same to the characteristic calculation unit 4.

Figure 3B:
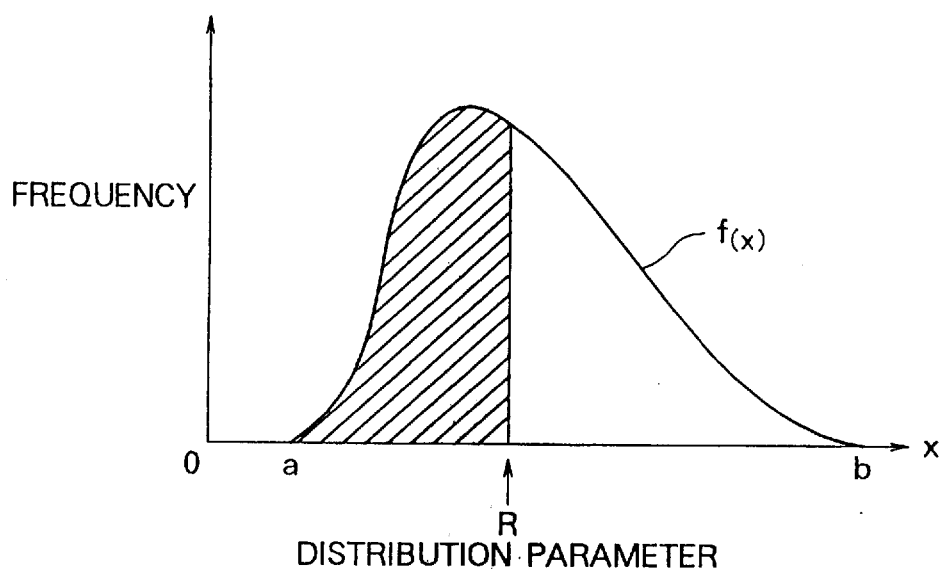

At STEP 3, the random number is generated. FIG. 3B is a graph for explaining the generation of the random number. The curve in FIG. 3B shows that the value of R is the random number in accordance with the function 1. The ratio of the integrated value (the shaded portion) from a to R to the integrated value of the function 1 from a to b is uniform in the range [0,1].

At STEP 4, the center of variation "DOSE" of Table 1 is changed on the basis of the random number $R_{n1}$, $R_{n2}$, ..., $R_{ni}$, ..., $R_{nm}$ generated at STEP 3, and the input data of the characteristic calculation are automatically set. For example, the input data shown in Table 2 are set by the first and second random numbers $R_{n1}$ and $R_{n2}$.

TABLE 2

...
IMPL DOPANT = BORON, DOSE = 4.889E13, ENERGY = 30keV
...
IMPL DOPANT = BORON, DOSE = 5.013E13, ENERGY = 30keV
...

Subsequent input data are similarly set until the m-th input data is set.

The set input data are sequentially sent to the characteristic calculation unit 4 to apply them to the formula $V_{th}(X_n)$ of the threshold voltage set at STEP 2, to sequentially result in the threshold values $V_{th}$. The resultant threshold values $V_{th}$ are output on the output and display unit 10 such as a display apparatus. Table 3 is an example of the output. This output is carried out in a form of display or print.

TABLE 3

IMPL DOPANT = BORON, DOSE = 4.889E13, ENERGY = 30keV:
Vth = 0.71V
. . .
. . .
IMPL DOPANT = BORON, DOSE = 5.013E13, ENERGY = 30keV:
Vth = 0.68
. . .

The above processing will be continued until the m-th characteristic calculation is terminated.

EXAMPLE 2

Example 2 is an example where the distribution information of the distribution parameter is given in a form of a histogram, and the simulation is carried out by varying the gate length of the transistor.

Table 4 is an example of the format at STEP 1.

TABLE 4

. . .
MASK LENGTH = 3.5, DEVI = LENGTH, HISTFILE = file1
. . .

Here, "DEVI=LENGTH" designates varying an exposure light amount of a stepper (stepping apparatus), where the center of the variation is 3.5. "HISTFILE=file 1" designates varying the gate length in accordance with the file 1 (file 1).

Table 5 shows the contents of the file 1.

TABLE 5

| LENGTH REGION | NUMBER |
| --- | --- |
| less than 3.0 | 0 |
| 3.0 to 3.2 | 10 |
| 3.2 to 3.4 | 75 |
| 3.4 to 3.6 | 120 |
| 3.6 to 3.8 | 45 |
| 3.8 to 4.0 | 31 |
| 4.0 to 4.2 | 6 |
| more than 4.2 | 0 |

Figure 4A:
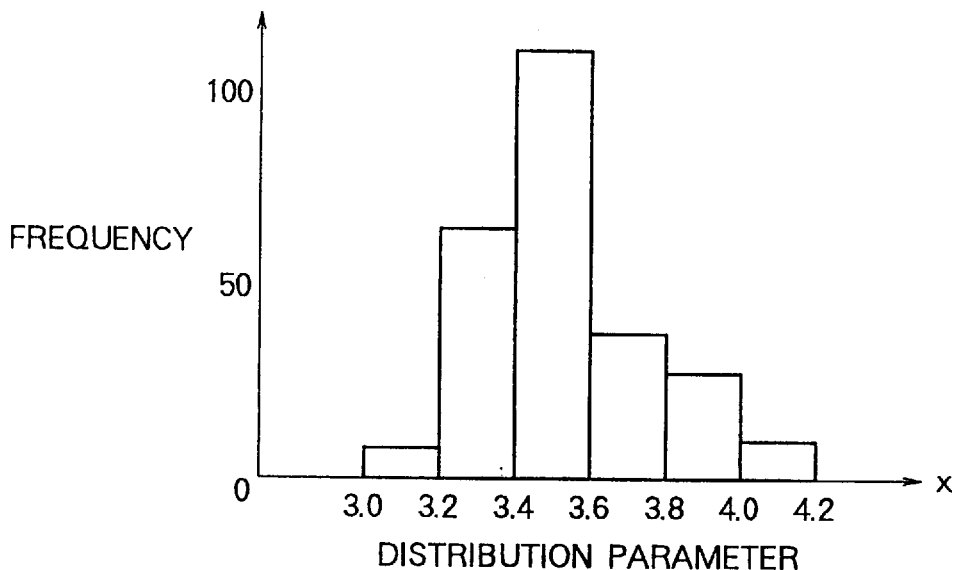
FIGS. 4A and 4B are graphs of distribution profile histograms applied to the simulation method of FIG. 2.

FIG. 4A is a graph of histograms of the contents in Table 5. The values of the histograms are obtained as the actual measurement values. Namely, in the present invention, the simulation of the Monte Carlo method can be carried out by using the actual distributions on the basis of the measurement values.

At STEP 2, the formula $V_{th}(X_n)$ of the threshold voltage of the transistor is given in the same way as Example 1.

Figure 4B:
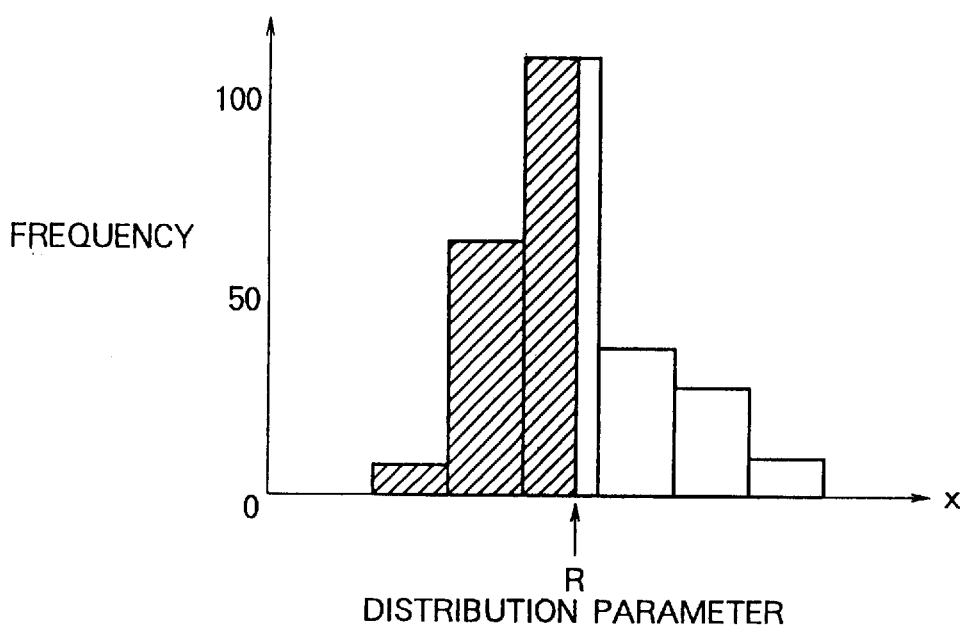

At STEP 3, the random numbers are generated. FIG. 4B is a graph for explaining the generation of the random number.

The total area A of the histograms is calculated by the following formula 5.

$$A=0.2\times10+0.2\times75+0.2\times120+0.2\times45+0.2\times31+0.2\times6 \quad (5)$$

FIG. 4B is a graph where the parameter R is subjected to the histograms, where the ratio of the area (shaded portion) of the histograms from a to R to the total area A of the histograms becomes uniform in the range [0,1].

At STEP 4, "LENGTH", of which the center of variation is 3.5, is changed in accordance with the generated random numbers $R_{n1}, R_{n2}, \ldots, R_{nm}$. As a result, the input data shown in Table 6 are set.

TABLE 6

. . .
MASK LENGTH = 3.445
. . .
. . .
MASK LENGTH = 3.661
. . .

The threshold voltage $V_{th}$ corresponding to the input data is calculated and displayed or printed in a predetermined format, similar to example 1.

In examples 1 and 2, the parameters are not limited to the above described matters, and such parameters can be modified in the scope of the present invention. For example, with respect to the application of the parameter distribution to the characteristic calculation, in the above description, the probability which may be accepted by the input of the physical formula is determined by using the generated random number, but, the probability which may be the output of the physical formula can be determined by using the random number.

Figure 5:
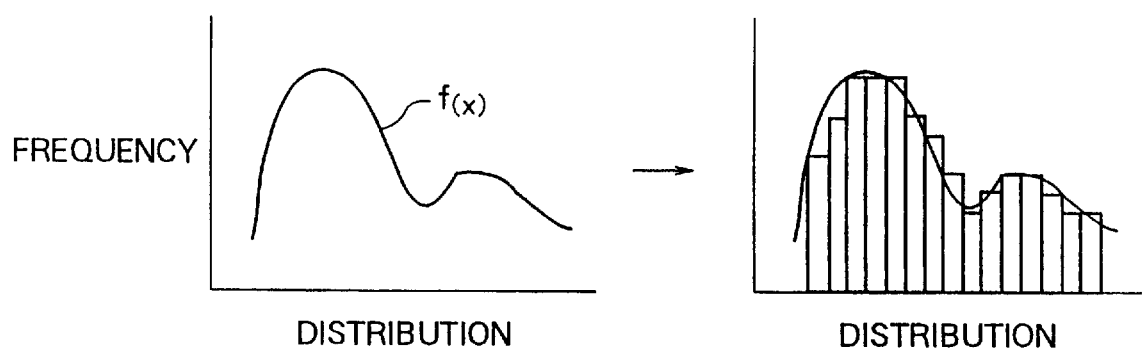
FIG. 5 is a graph of a distribution profile curve applied to the simulation method of FIG. 2.

The present embodiment is not restricted to Examples 1 and 2. For example, the input of the distribution of the parameters can be the numerical data series which are raw actual measurement data, in addition to the general distribution function of Example 1 and the histogram of Example 2. A means for changing the numerical data series to the histograms can be provided. Similarly, a means for changing a function to a histogram can be provided. In this case, a complex function as shown in FIG. 5, where it is not easy to calculate the integration, should be expressed by histograms; as a result, the input setting becomes simple. That is, the present invention can accept any parameters for the distribution information.

In the above description, the process parameters are described as examples, but in the present invention, the device parameters can also be accepted. For example, the fluctuation of the noise degree of the transistor with respect to the variation of the gate resistance can be estimated, or the effect on the current characteristic of the transistor by the variation of the parasitic resistance can be estimated.

As discussed above, in accordance with the present embodiment, it is possible to predict (estimate) a variety of the characteristic of the semiconductor circuit, not only when the profile of the parameters to be estimated and affecting the characteristic variations is a normal distribution but also when the profile can be any distribution.

SECOND EMBODIMENT

In the conventional simulation of the semiconductor circuit, parameters are varied by random numbers and the progressive calculations using physical formulas are performed for the resultant multi-characteristic calculated points. In this simulation, a combination of calculations is required. When the number of the parameters is n, $10^n$ of calculations is required.

To overcome this disadvantage, in the present invention, to reduce the number of the calculations while maintaining accuracy of the simulated results, the sampling for the characteristic calculation points is carried out from around the distribution center of the parameters, and the distribution of the whole characteristics is estimated from the resultant characteristic calculated data at the sampling points by using a statistical calculation method in which a moment development approach is employed.

Statistical Calculation Method Using the Moment Development Approach

Before describing the present embodiment, the statistical calculation method in which the moment development approach is employed will be described.

When the relationship $y=f(X_1, X_2, \ldots X_n)$ stands between average values $(X_1, X_2, \ldots X_n)$ containing errors obtained by the experiment (or the measurement) and the value y to be obtained, the distribution from the average of y can be calculated by using the moment development approach.

An element $X_i$ of the average values $(X_1, X_2, \ldots X_n)$ is an average of several experimental values, and may contain the measurement error, an instrument error or other errors. The statistical natures of the elements are known. It is considered that second to fourth moments of y are obtained by the development up to a third of a first to third developments of the function $f(x_1, x_2, \ldots x_n)$.

The change $\Delta y$ of y can be developed by the following formula 6, for small (micro-scopic) portions (displacements) $\Delta X = (\Delta X_1, \Delta X_1, \ldots, \Delta X_n)$.

$$\Delta y = f(X + \Delta X) - f(X) \quad (6)$$
$$= \sum_i f_i(X)\Delta X_i + \frac{1}{2!} \sum_{ij} f_{ij}(X)\Delta X_i \Delta X_j + \frac{1}{3!} \sum_{ijk} f_{ijk}(X)\Delta X_i \Delta X_j \Delta X_k + \ldots$$

where, $$f_i(X) = \left.\frac{\partial f(x)}{\partial x_i}\right|_{x=X}$$

$$f_{ij}(X) = \left.\frac{\partial^2 f(x)}{\partial x_i \partial x_j}\right|_{x=X}$$

$$f_{ijk}(X) = \left.\frac{\partial^3 f(x)}{\partial x_i \partial x_j \partial x_k}\right|_{x=X}$$

Accordingly, a secondary moment $<\Delta y^2>$ which is an average of the second power of $\Delta y$ can be expressed by the following formula 7.

$$<\Delta y^2> = \left\langle \left(\sum_i f_i(X)\Delta X_i + \frac{1}{2!}\sum_{ij} f_{ij}(X)\Delta X_i \Delta X_j + \frac{1}{3!}\sum_{ijk} f_{ijk}(X)\Delta X_i \Delta X_j \Delta X_k + \ldots\right)^2 \right\rangle = \left\langle \left(\sum_i f_i(X)\Delta X_i\right)^2 + \left(\sum_i f_i(X)\Delta X_i\right)\cdot\left(\sum_{ij} f_{ij}(X)\Delta X_i \Delta X_j\right) + \left(\frac{1}{2!}\sum_{ij} f_{ij}(X)\Delta X_i \Delta X_j\right)^2 + \frac{2}{3!}\left(\sum_i f_i(X)\Delta X_i\right)\cdot\left(\sum_{ijk} f_{ijk}(X)\Delta X_i \Delta X_j \Delta X_k\right) + \ldots \right\rangle \quad (7)$$

The first expression of the right side of the above formula 7 is a term expressing an average of a power of two of $\Delta X$, the second expression is a term expressing an average of a power of three of $\Delta X$, and the third and fourth expressions are terms expressing an average of a power of four of $\Delta X$. These terms can be expressed as follows:

$$<\Delta y^2>_2 = \sum_{ij} f_i(X)f_j(X)f(\Delta X_i \Delta X_j) \quad (8)$$

$$<\Delta y^2>_3 = \sum_{ijk} f_i(X)f_{ij}(X) <\Delta X_i \Delta X_j \Delta X_k> \quad (9)$$

$$<\Delta y^2>_4 = \sum_{ijkl} \left(\frac{1}{4} f_{ij}(X)f_{kl}(X) + \frac{1}{3} f_i(X)f_{jkl}(X)\right)(\Delta X_i \Delta X_j \Delta X_k \Delta X_l) \quad (10)$$

As discussed above, the development terms up to the fourth power of $\Delta X_i$ of the moment of the second power of y can be obtained.

Similarly, terms of averages of the third to fifth powers of $\Delta X$ at $<\Delta y^3>$ which is the moment of the third power of y, and an average term of the fourth power of $\Delta X$ at $<\Delta y^4>$ which is the moment of the fourth power of y, can be obtained as follows:

$$<\Delta y^3>_3 = \sum_{ijk} f_i(X)f_j(X)f_k(X)(\Delta X_i \Delta X_j \Delta X_k) \quad (11)$$

$$<\Delta y^3>_4 = \frac{3}{2}\sum_{ijkl} f_i(X)f_j(X)f_{kl}(X)(\Delta X_i \Delta X_j \Delta X_k \Delta X_l) \quad (12)$$

$$<\Delta y^3>_5 = \quad (13)$$

$$\sum_{ijklm} \left(\frac{3}{4} f_i(X)f_{jk}(X)f_{lm}(X) + \frac{1}{2} f_i(X)f_j(X)f_{klm}(X)\right)(\Delta X_i \Delta X_j \Delta X_k \Delta X_l \Delta X_m)$$

$$<\Delta y^4>_4 = \sum_{ijkl} f_i(X)f_j(X)f_k(X)f_l(X)(\Delta X_i \Delta X_j \Delta X_k \Delta X_l) \quad (14)$$

Here, supposing that the respective experiment values $X_i$ are independent each other, namely, $<\Delta X_i \Delta X_j> = \delta_{ij} <\Delta X_i^2>$, moments equal to or more than the third power can be modified as follows:

$$<\Delta X_i \Delta X_j \Delta X_k> = \sigma_{ij}\sigma_{jk}<\Delta X_i^3>$$

$$<\Delta X_i \Delta X_j \Delta X_k \Delta X_l> = \sigma_{ij}\sigma_{kl}<\Delta X_i^2><\Delta X_k^2> + \sigma_{ik}\sigma_{jl}<\Delta X_i^2><\Delta X_j^2> +$$
$$\sigma_{il}\sigma_{jk}<\Delta X_i^2><\Delta X_j^2> - 3\sigma_{ij}\sigma_{jk}\sigma_{kl}<\Delta X_i^2>^2 + \sigma_{ij}\sigma_{jk}\sigma_{kl}<\Delta X_i^4>$$

$$<\Delta X_i \Delta X_j \Delta X_k \Delta X_l \Delta X_m> =$$
$$\sigma_{ij}\sigma_{kl}\sigma_{lm}<\Delta X_i^2><\Delta X_k^3> + \sigma_{ik}\sigma_{jl}\sigma_{lm}<\Delta X_i^2><\Delta X_j^3> +$$
$$\sigma_{il}\sigma_{jk}\sigma_{km}<\Delta X_i^2><\Delta X_j^3> + \sigma_{im}\sigma_{jk}\sigma_{kl}<\Delta X_i^2><\Delta X_j^3> +$$
$$\sigma_{jk}\sigma_{il}\sigma_{lm}<\Delta X_j^2><\Delta X_i^3> + \sigma_{jl}\sigma_{ik}\sigma_{km}<\Delta X_j^2><\Delta X_i^3> +$$
$$\sigma_{jm}\sigma_{ik}\sigma_{kl}<\Delta X_j^2><\Delta X_i^3> + \sigma_{kl}\sigma_{ij}\sigma_{jm}<\Delta X_k^2><\Delta X_i^3> +$$
$$\sigma_{km}\sigma_{ij}\sigma_{jl}<\Delta X_k^2><\Delta X_i^3> + \sigma_{lm}\sigma_{ij}\sigma_{jk}<\Delta X_i^2><\Delta X_i^3> -$$
$$10\sigma_{ij}\sigma_{jk}\sigma_{kl}\sigma_{lm}<\Delta X_i^2><\Delta X_i^3> + \sigma_{ij}\sigma_{jk}\sigma_{kl}\sigma_{lm}<\Delta X_i^5>$$

By the definition, $<\Delta X_i>=0$.

Under the condition that each experimental value $X_i$ is independent, and using the above equations, the development term of the moment of $\Delta y$ derived as the above formulas 8 to 10 can be modified as follows:

$$<\Delta y^2>_2 = \sum_i (f_i(X))^2 <\Delta X_i^2> \quad (15)$$

$$<\Delta y^2>_3 = \sum_i f_i(X)f_{ii}(X)<\Delta X_i^3> \quad (16)$$

$$<\Delta y^2>_4 = \quad (17)$$

-continued $$\sum_{i \neq j} \left( \frac{1}{4} f_{ii}(X)f_{jj}(X) + \frac{1}{2} f_{ij}(X)f_{ij}(X) + 2f_i(X)f_{ijj}(X) \right) <\Delta X_i^2><\Delta X_j^2> +$$

$$\sum_i \left( \frac{1}{4} (f_{ii}(X))^2 + \frac{2}{3} f_i(X)f_{iii}(X) \right) <\Delta X_i^4>$$

$$<\Delta y^3>_3 = \sum_i (f_i(X))^3 <\Delta X_i^3> \quad (18)$$

$$<\Delta y^3>_4 = \quad (19)$$

$$\frac{3}{2} \sum_{i \neq j} (f_i(X)f_i(X)f_{jj}(X) + 2f_i(X)f_j(X)f_{ij}(X)) <\Delta X_i^2> <\Delta X_j^2> +$$

$$\frac{3}{2} \sum_i f_i(X)f_i(X)f_{ii}(X) <\Delta X_i^4>$$

$$<\Delta y^3>_5 = \quad (20)$$

$$\frac{1}{2} \sum_{i \neq j} (6f_i(X)f_{ij}(X)f_{jj}(X) + 3f_j(X)f_{ii}(X)f_{ij}(X) + 3f_j(X)f_{ij}(X)f_{ij}(X) +$$

$$f_i(X)f_i(X)f_{jjj}(X) + 6f_i(X)f_j(X)f_{ijj}(X) + 3f_j(X)f_j(X)f_{iij}(X)) <\Delta X_i^2><\Delta X_j^3> +$$

$$\frac{1}{4} \sum_i (3f_i(X)f_{ii}(X)f_{ii}(X) + 2f_i(X)f_i(X)f_{iii}(X)) <\Delta X_i^5>$$

$$<\Delta y^4>_4 = 3 \sum_{i \neq j} (f_i(X))^2(f_j(X))^2 <\Delta X_i^2><\Delta X_j^2> + \sum_i (f_i(X))^4 <\Delta X_i^4> \quad (21)$$

It is understood from the above formulas 15 to 21 that, under the condition that each experimental value $X_i$ is independent, the moment of the second power of y and the third power of y can be expressed as $<\Delta X_i^n>$.

Further, under the condition that each experimental value $X_i$ is subjected by the Gaussian distribution, the formula can be further simplified. In this condition, the moment of the experimental data stands the following relationship.

$$<\Delta X_i^n> = \begin{cases} 1 \cdot 3 \ldots (n-1)v_i^{n/2} & n \text{ even} \\ 0 & n \text{ odd} \end{cases}$$

Here, $v_i = <\Delta X_i^2>$ is generally called a variance. By using this relationship, the above formulas 15 to 21 of the moment of y can be simplified as the following formulas.

$$<\Delta y^2>_2 = \sum_i (f_i(X))^2 v_i \quad (22)$$

$$<\Delta y^2>_3 = 0 \quad (23)$$

$$<\Delta y^2>_4 = \sum_{ij} \left( \frac{1}{4} f_{ii}(X)f_{jj}(X) + \frac{1}{2} f_{ij}(X)f_{ij}(X) + 2f_i(X)f_{ijj}(X) \right) v_i v_j \quad (24)$$

$$<\Delta y^3>_3 = 0 \quad (25)$$

$$<\Delta y^3>_4 = \frac{3}{2} \sum_{ij} (f_i(X)f_i(X)f_{jj}(X) + 2f_i(X)f_j(X)f_{ij}(X)) v_i v_j \quad (26)$$

$$<\Delta y^3>_5 = 0 \quad (27)$$

$$<\Delta y^4>_5 = 3 \sum_{ij} (f_i(X))^2 (f_j(X))^2 v_i v_j \quad (28)$$

As discussed above, under the condition where the respective experimental values $X_i$ are independent and are subjected by the Gaussian distribution, since the moments of the odd power become zero, the formulas to be obtained contain the variance $v_i$ of the respective experimental values $X_i$, and can be expressed by the development terms of the even power. The formulas 22 to 28 are simple.

In general, the simulation of the semiconductor circuit is defined as finding the functions deriving the semiconductor circuit characteristics from the given distribution parameters.

Between the predetermined distribution parameters ($X_1$, $X_2$, . . . , $X_n$) which are varied in accordance with the Gaussian distribution, and the characteristics y of the semiconductor circuit, the relationship of $y=f(X_1, X_2, \ldots, X_n)$ stands, then, the statistical natures of the characteristics y of the semiconductor circuit, i.e. the distribution characteristics may be found by the statistical natures of the distribution parameters ($X_1, X_2, \ldots, X_n$).

When finding the statistical natures, the variances are used as the statistical natures of the distribution parameters ($X_1, X_2, \ldots, X_n$) given as conditions, and the statistical natures of the characteristics y of the semiconductor circuit to be found are derived as the variances, then, the numerical calculations can be carried out by using the above simplified formulas 22 to 28. However, if calculating the differentials (derivations) of the function f is troublesome, then, in the present invention, in the same way as the usual numerical calculations by the computers, the finite differences are performed instead of the differentials (derivation). Note, the calculation accuracy and the repeat (iteration) number are varied in accordance with the finite difference method, the care should be taken and a suitable finite difference should be adapted.

EXAMPLE 3

Example 3 is a case where a first order differential coefficient term, namely, only the formula 22 is used as an approximation term $N_i$ (a distribution approximation term) of the variance $<\Delta y^2>$ due to the variations of each parameter.

As described above, the formula 22 is replaced by a first order finite differential, then, in Example 3, the first order finite differential is defined as follows:

$$\delta_i f = f(x_1, x_2, \ldots, x_i + \delta x_i, \ldots, x_n) - f(x_1, x_2, \ldots, x_i, \ldots, x_n) \quad (29)$$

This formula means that the change of f is calculated when only the i-th condition $X_i$ is changed by $\delta x_i$, and thus, the numerical calculation can be made. Developing this formula on $\delta x_i$, the formula can be rearranged about $f_i(x)$.

$$\delta_i f = f_i(x)\delta x_i + \frac{1}{2!} f_{ii}(x)\delta x_i^2 + \frac{1}{3!} f_{iii}(x)\delta x_i^3 + \ldots \rightarrow f_i(x) = \quad (30)$$

$$\frac{\delta_i f}{\delta x_i} - \frac{1}{2!} f_{ii}(x)\delta x_i - \frac{1}{3!} f_{iii}(x)\delta x_i^2 + \ldots$$

If $\delta x_i$ is selected so that the value of a first term in the right side of the formula is sufficiently larger than the values of the subsequent terms, the differential (derivation) can be replaced by the finite differential, and thus the formula 27 can be expressed as the following formula.

$$<\Delta y^2>_2 = \sum_i \left( \frac{\delta_i f(X)}{\delta x_i} \right)^2 v_i \quad (31)$$

This simplest distribution approximation term $N_i$ expressed by the finite differential coefficients is obtained by this formula. If the variances expressed by the distribution approximation term $N_i$ can be obtained for n parameters, under the conditions that each parameter is independent, as well known, a standard deviation $\delta$ of the characteristics of the semiconductor circuit can be obtained by the following formula.

$$\sigma = \sqrt{N_1^2 + N_2^2 + \ldots + N_n^2} \qquad (32)$$

In Example 3, as defined as the formula 29, the total number of the calculations for the center points ($X_1$, $X_2$, ..., $X_n$) and the points ($X_1$, $X_2$, ..., $X_i+\delta x_i$, ..., $X_n$) selected for the respective parameters is (n+1).

The specific embodiment will be described with reference to the accompanying drawings.

Figure 6:
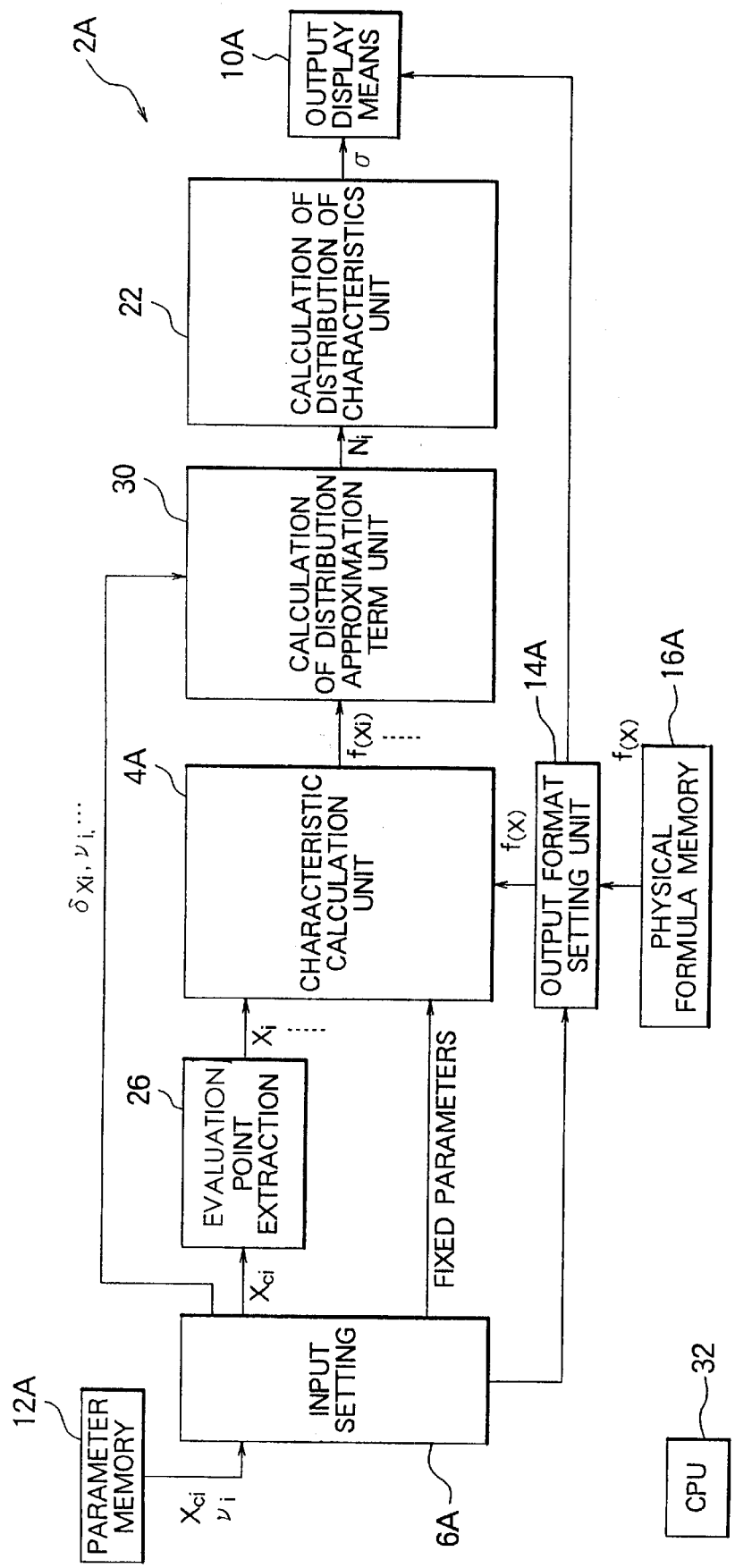
FIG. 6 is a block diagram of a simulator apparatus of second to fifth embodiments in accordance with the present invention.

FIG. 6 is a block diagram of a simulator 2A of the second embodiment of the present invention.

The simulator 2A samples at least two points where the characteristics calculations will be performed for the parameters affecting the characteristics of the semiconductor circuit, and performs the characteristic calculations at those points. The simulator 2A calculates the distribution approximation term $N_i$ defined by the formula 31 on the basis of the two results of the characteristic calculations. Finally, the simulator 2A calculates the standard deviation δ as the distribution characteristic of the semiconductor circuit by using the formula 32.

The simulator 2A comprises an input setting unit (means) 6A for inputting or setting the distribution center values $X_{ci}$ and the variance $v_i$ of i-th parameter. The simulator 2A also comprises an output and display unit (means) 10A for outputting or displaying the simulated results. The simulator 2A comprises an evaluation point extraction unit (means) 26 for sampling two evaluation points (sampling points) at which the characteristic calculations are performed. In the sampling of this embodiment, the distribution center value $X_{ci}$ and a point apart from the distribution center value $X_{ci}$ by a predetermined distribution ratio are selected as the two sampling points.

As a means for calculating the above calculation values, namely, the characteristic values $f(X_i)$ and $f(Xc_i)$ at the sampling points, the distribution approximation term $N_i$ and the standard deviation δ, the simulator 2A comprises a characteristic calculation unit (means) 4A, a distribution approximation term calculation unit (means) 30 and a distribution characteristic calculation unit (means) 22.

The simulator 2A comprises a parameter memory 12A connected to the input setting unit 6A. The parameter memory 12A previously stores the distribution center value $Xc_i$ and the deviance $v_i$, as a proper distribution information of the parameter $X_i$.

The simulator 2A comprises an output setting unit (means) 14A provided between the setting unit 6A and the output and display unit 10A to switch the output and display unit 10A.

The simulator 2A comprises a physical formula memory 16A for storing dominant formulas f(x) of the physical characteristics of a semiconductor circuit, used for the characteristic calculation. The physical formulas f(x) are transferred to the characteristic calculation unit 4A through the output setting unit 14A.

The input setting unit 4 is connected to a key input apparatus (not shown) for inputting operational instructions, a data read apparatus (not shown) for reading the distribution information of parameters Xi stores in an external recording medium, an interface (not shown) for recording the distribution information from an external equipment (not shown), etc.

The output and display unit 14 is formed by, for example, a display apparatus such as a TV monitor, a printer, a plotter, and/or other apparatuses. If the output and display unit 10A is configured by a plurality of apparatuses (or equipments), the switching of the apparatuses can be carried out by the operational instructions set at the input setting unit 6A and applied to the output and display unit 10A through the output setting unit 14A.

The simulator 2A comprises a central processing unit (CPU) 32 which monitors and controls the operations of the input setting unit 6A, the output and display unit 10A, the evaluation point extraction unit 26, the characteristic calculation unit 4A, the distribution approximation term calculation unit 30, the characteristic distribution calculation unit 22, the parameter memory 12A, the output setting unit 14A, and the physical formula memory 16A. When the distribution information and the physical formulas f(x) are supplied from an external apparatus through the input setting unit 6A, the parameter memory 12A and the physical formula memory 16A can be removed. Also, the parameter memory 12A and the physical formula memory 16A can be replaced by a common memory. The output setting unit 14A can be omitted when the grade of the output and display unit 10A and the output formats thereof are previously determined.

Figure 7:
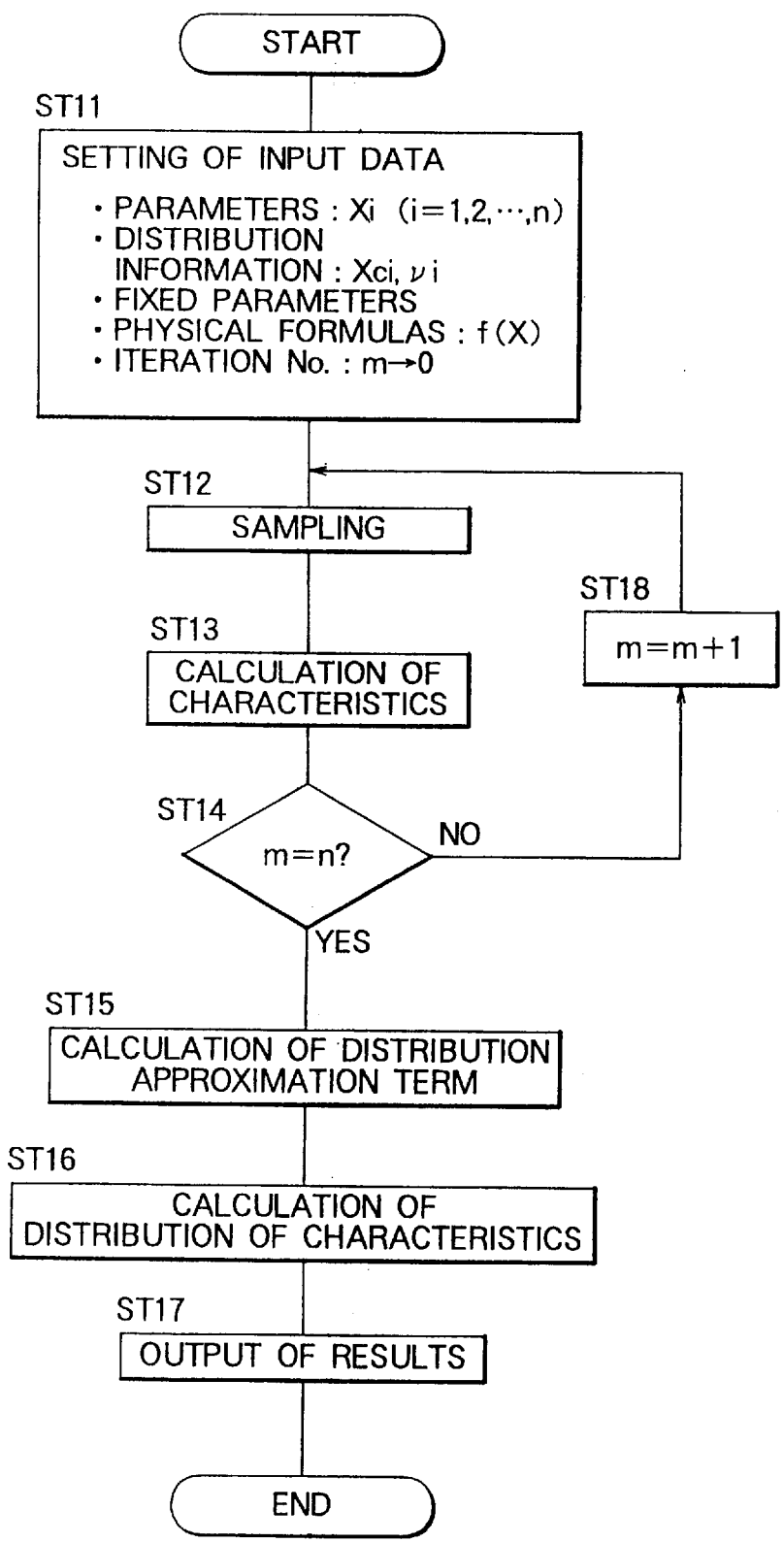
FIG. 7 is a flow chart of a simulation method operating in the simulation apparatus of FIG. 6.

The operation of the simulator 2A will be described with reference to FIG. 7. FIG. 7 is a flow chart of the simulation method of the second embodiment of the present invention.

STEP 11 (ST11)

The input setting is performed by the input setting unit 6A. The n piece of parameters ($X_1$, $X_2$, ..., $X_n$), which should be varied at random, among a variety of parameters, are selected and the selected distribution information is input or set. In the embodiment, it is assured that the parameters are distributed at the normal distribution, the distribution information comprises at least the distribution center values ($Xc_1$, $Xc_2$, ..., $Xc_n$) and the deviances ($v_1$, $v_2$, ..., $v_n$). Other fixed parameters are set manually or from the parameter memory 12A. Further, the grade of the physical formula f(x) is decided and the processing repeat (iteration) number m is initiated.

At the same time, the output setting is also carried out in the same manner as the operation of STEP 2 shown in FIG. 2. The output setting is carried out by the operational instruction set at the input setting unit 6A and transferred through the output setting unit 14A. Namely, the predetermined physical formula f(x), which dominates the semiconductor circuit characteristics to be predicted (estimated) and the effect due to the variations of the parameters, is read from the physical formula memory 16A. Then, the switching of the output and display unit 10A is done, if required.

STEP 12 (ST12)

Figure 8:
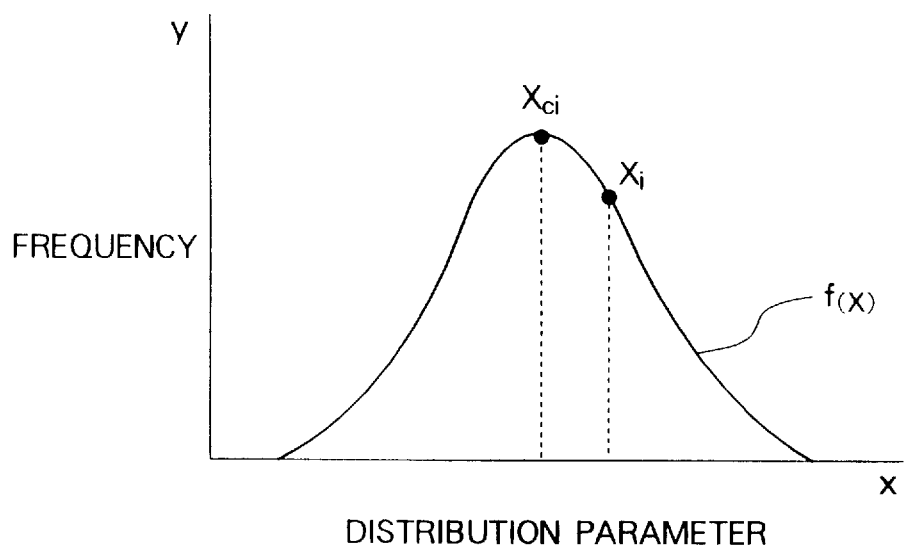
FIGS. 8 is a graph of distribution profile curves applied to the simulation method of FIG. 7.

The sampling for the evaluation points is carried out by the evaluation point extraction unit 26. The evaluation point extraction unit 26 samples the distribution center value $Xc_1$ and a point $X_1$ apart from the distribution center value $Xc_1$ by a predetermined ratio (rate), for the first parameter set at STEP 11, as shown in FIG. 8. The determination of the distribution ratio (rate) is not limited. As one example, the point x can be selected as a positioned at a point larger than a predetermined percentage (%) or smaller than the predetermined percentage (%). Alternatively, the point x is determined by calculating a standard deviation δ1, from the deviance $v_1$ as the distribution information and deciding that point larger than a predetermined percent of the resultant standard deviation $\delta_1$ or smaller than the predetermined percent of the resultant standard deviation $\delta_1$.

STEP 13 (ST13)

The characteristic calculation for the sampled two points $Xc_1$ and $X_1$ is performed at the characteristic calculation unit 4A, to solve the physical formula f(x) read at STEP 11 and to result in two characteristic values f(Xc$_1$) and f(X$_1$).

For example, the semiconductor circuit is a transistor, as typical physical formulas dominating the physical natures of the transistor, characteristic formulas derived from the following formulas can be employed.

$\nabla(\epsilon\nabla\phi)=q(n-p-C)$ Poisson's equation $-\nabla \cdot J_n + qR = 0$ electron-current continuous equation $-\nabla \cdot J_p - qR = 0$ positive hole-current continuous equation

STEP 14 (ST14)

The processing repeat number m for sampling and calculating the characteristics is checked and the processings (operations) at STEP 12 and STEP 13 will be repeated until the number m reaches to the number n. Note, the subsequent processings do not sample and calculate the characteristics for the distribution center point $Xc_1$, since the sampling and calculation for the distribution center point $Xc_1$ is already performed. The number of the processing is (n+1) in total.

STEP 15 (ST15)

The distribution approximation term $N_i$ is calculated at the distribution approximation term calculation unit 30 in accordance with the formula 31. Namely, a gradient d of a line connecting two sampling points $Xc_i$ and $X_i$ is multiplied to the deviance $v_i$ set at STEP 11, the second power of the resultant $d \cdot v_i$ is calculated, and a summation of the second power, i.e., the distribution approximation term $N_i$ is further calculated. In this way, the distribution approximation terms $N_i$ are obtained for each parameter. Note this calculation of the distribution approximation terms can be done at STEP 12 or STEP 13.

STEP 16 (ST16)

The standard deviation $\delta$ is obtained as the distribution characteristic at the distribution characteristic calculation unit 22 in accordance with the formula 32.

STEP 17 (ST17)

The output and display unit 10A outputs the resultant standard deviation $\delta$ in accordance with the output format designated at STEP 11.

Thereafter, the simulation is terminated.

THIRD EMBODIMENT

A third embodiment of the present invention is a modification of the second embodiment.

In the third embodiment, the first order differential coefficient term is employed as the distribution approximation term $N_i$ as same as the second embodiment, but the manner of the first order finite differential differs from that of the second embodiment to obtain a high accuracy approximation.

In the second embodiment, the first finite differential is defined by the formula 18. In the third embodiment, the first finite differential is defined by the following formula 33.

Figure 9:
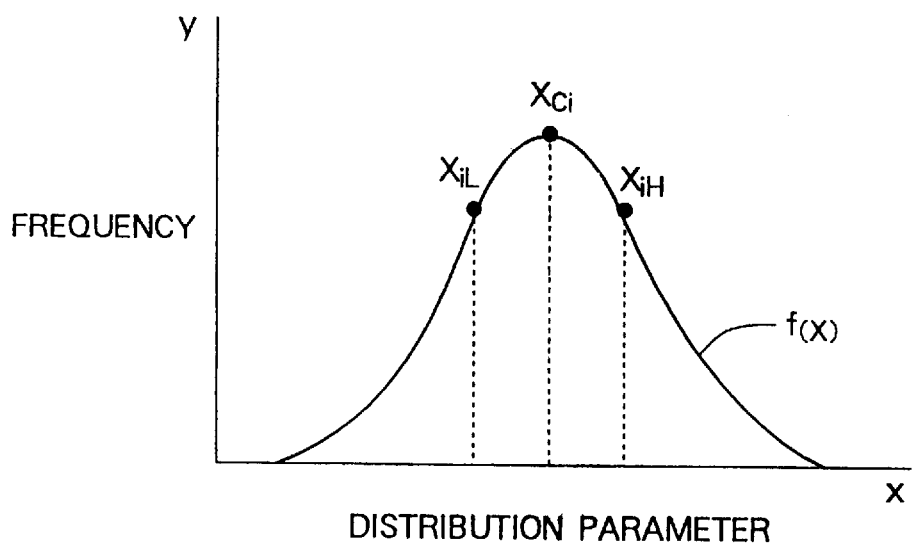
FIGS. 9 is a graph of distribution profile histograms applied to the simulation method of FIG. 7.

In the third embodiment, the sampling is carried out for two points $X_{iH}$ and $X_{iL}$, which are spaced from the distribution center point at equal distances as shown by the formula 33 and as shown in FIG. 9, and the characteristic calculation is performed for the two sampled points.

Developing the formula 33 and arranging the same, the formula 34 is obtained. Namely, the formula 22 is expressed by the formula 35.

$$\sigma_i * f = \frac{1}{2}(f(\ldots, x_i + \sigma x_i, \ldots) - f(\ldots, x_i - \sigma x_i, \ldots)) \quad (33)$$

$$= f_i(x)\sigma x_i + \frac{1}{3!}f_{iii}(x)\sigma x_i^3 + \frac{1}{5!}f_{iiiii}(x)\sigma x_i^5 + \ldots$$

$$\rightarrow f_i(x) = \frac{\sigma_i * f}{\sigma x_i} - \frac{1}{3!}f_{iii}(x)\sigma x_i^2 - \frac{1}{5!}f_{iiiii}(x)\sigma x_i^4 + \ldots \quad (34)$$

$$\approx \frac{\sigma_i * f}{\sigma x_i}$$

$$\langle \Delta y^2 \rangle_2 = \sum_i \left( \frac{\sigma_i * f(X)}{\sigma x_i} \right)^2 v_i \quad (35)$$

Comparing the formula 34 with the formula 30 obtained in the second embodiment, a residual term of the formula 34 is a second power of $\delta x_i$, and a residual term of the formula 30 is a first power of $\delta x_i$, and thus, the formula 34 shows a higher accuracy of approximation than the formula 30.

The simulator configuration of the third embodiment and the operation thereof are similar to that of the second embodiment. But, in the third embodiment, the sampling at STEP 12 of FIG. 7 and the characteristic calculation at STEP 13 are carried out in accordance with the formula 30.

Note, in the third embodiment, the sampling and the characteristic calculation is performed for two sampling points $X_{iH}$ and $X_{iL}$, and 2n times of the processing is need in total. The accuracy of the result of the third embodiment is higher than that of the second embodiment, but the processing time of the third embodiment is longer than that of the second embodiment.

FOURTH EMBODIMENT

To improve the accuracy of the approximation solution, a fourth embodiment obtains a higher order moment, i.e. the third order moment.

The basic concept of the fourth embodiment is similar to those of the second and third embodiments. Namely, a suitable finite differential is defined, and developed to transform from the differential (derivation) to the finite differential to derive the transformation formula in a form of the finite differential, and to express the formulas 22 to 28 as the finite differential coefficients by using the transformation formula.

As seen from the formula 26, it is necessary to obtain $f_{ii}(X)$ and $f_{ij}(X)$, ($i \ne j$).

To obtain $f_{ii}(X)$, supposing a second order finite differential as the following formula 36, developing the same and arranging for $f_{ii}(X)$, the following formula 37 can be obtained.

$$\sigma_{ii}f = f(\ldots, x_i + \sigma x_i, \ldots) - 2f(\ldots, x_i, \ldots) + \quad (36)$$

$$f(\ldots, x_i - \sigma x_i, \ldots)$$

$$= f_{ii}(x)\sigma x_i^2 + \frac{1}{2}f_{iiii}\sigma x_i^4 + \ldots$$

$$f_{ii}(x) = \frac{\sigma_{ii}f}{\sigma x_i^2} - \frac{1}{2}f_{iiii}\sigma x_i^2 + \ldots \quad (37)$$

$$\approx \frac{\sigma_{ii}f}{\sigma x_i^2}$$

To obtain $f_{ij}(X)$, supposing the finite difference $\delta f_{ij}$ (i<j) as the following formula 38, developing the same and arranging on $f_{ij}(X)$, the following formula 39 can be obtained.

$$\begin{aligned}\sigma_{ij} f &= f(\ldots, x_i + \sigma x_i, x_j + \sigma x_j, \ldots) f(\ldots, x_i + \sigma x_i, x_j, \ldots) - \\ &\quad f(\ldots, x_{i,j} + \sigma x_j, \ldots) + f(\ldots, x_i + \sigma x_i, \sigma x_j, \ldots) \\ &= f_{ij}(x) \sigma x_i \sigma x_j + \frac{1}{2} f_{iij} \sigma x_i^2 \sigma x_j + \frac{1}{2} f_{ijj} \sigma x_i \sigma x_j^2 + \ldots\end{aligned}$$ (38)

$$\begin{aligned}\rightarrow f_{ij}(x) &= \frac{\sigma_{ij} f}{\sigma x_i \sigma x_j} - \frac{1}{2} f_{iij} \sigma x_i - \frac{1}{2} f_{ijj} \sigma x_j + \ldots \\ &\approx \frac{\sigma_{ij} f}{\sigma x_i \sigma x_j}\end{aligned}$$ (39)

By the above $f_{ii}(X)$ and $f_{ij}(X)$ and $f_i(X)$ in the third embodiment, all of the third order moments in the formulas 22 to 28 are expressed by the finite differential coefficients.

In the embodiment, calculation points for calculating the finite differentials are, $(X_1, X_2, \ldots, X_n)$, $(\ldots, X_i + \delta x_i, \ldots)$, and $(\ldots, X_i + \delta x_i, X_j + \delta x_j, \ldots)$. The number of the calculation for the n piece of the parameters is $n(n-1)/2 + 2n + 1 = (n^2 + 3n + 2)/2$. Compared with the second and third embodiments, the fourth embodiment has increased accuracy of approximation, but suffers from the disadvantage of low calculation speed.

The configuration of a simulator at the operation of the fourth embodiment is similar to those of the second and third embodiments. Of course, the processing at STEP 12 and STEP 11 shown in FIG. 7 of the fourth embodiment differs from the second and third embodiments.

FIFTH EMBODIMENT

To further improve an accuracy of the approximation solution, in a fifth embodiment, a fourth order moment will be obtained. The basic concept of the fifth embodiment is similar to that of the second to fourth embodiments. The differential coefficients required for obtaining the fourth order moment, are $f_i(X)$, $f_{ii}(X)$, $f_{ij}(X)$, $f_{iii}(X)$, $f_{iij}(X)$. The obtaining of $f_i(X)$, $f_{ii}(X)$, and $f_{ij}(X)$ was discussed.

To obtain $f_{iii}(X)$, defining a third order finite differential $\delta_{iii} f$ as the following formula 40, developing the same, arranging for $f_{iii}(X)$, the following formula 41 can be obtained.

$$\begin{aligned}\sigma_{iii} f &= \frac{1}{2}(f(x_1, \ldots, x_1 + 2\sigma x_i, \ldots) - 2f(x_1, \ldots, x_i + \sigma x_i, \ldots) + \\ &\quad 2f(x_1, \ldots, x_1 - \sigma x_1, \ldots) - f(x_1, \ldots, x_1 - 2\sigma x_1, \ldots)) \\ &= f_{iii}(x) \sigma x_i^3 + \frac{1}{4} f_{iiiii}(x) \sigma x_i^5 + \frac{1}{40} f_{iiiiiii}(x) \sigma x_i^7 + \ldots\end{aligned}$$ (40)

$$f_{iii}(x) = \frac{\sigma_{iii} f}{\sigma x_i^3} - \frac{1}{4} f_{iiiii}(x) \sigma x_i^2 - \frac{1}{40} f_{iiiiiii}(x) \sigma x_i^4 + \ldots$$ (41)

$$\approx \frac{\sigma_{iii} f}{\sigma x_i^3}$$

To obtain $f_{iij}(X)$, defining a finite differential $\delta_{iij} f$ as the following formula 42, developing the same and arranging for $f_{iij}(X)$, the following formula 43 can be obtained.

$$\begin{aligned}\delta_{ij} f &= \frac{1}{4}(f(\ldots, x_i + \delta x_i, x_j + \delta x_j, \ldots) - f(\ldots, x_i + \delta x_i, x_j - \delta x_j, \ldots) - \\ &\quad f(\ldots, x_i - \delta x_i, x_j + \delta x_j, \ldots) - f(\ldots, x_i - \delta x_i, x_j - \delta x_j, \ldots)) \\ &= f_{ij} \delta x_i \delta x_j + \frac{1}{6} f_{iiij} \delta x_i^3 \delta x_j + \frac{1}{6} f_{ijjj} \delta x_i \delta x_j^3 + \ldots\end{aligned}$$ (42)

$$f_{ij}(x) = \frac{\delta_{ij} f(x)}{\delta x_i \delta x_j} + \frac{1}{6} f_{iiij}(x) \delta x_i^2 + \frac{1}{6} f_{ijjj}(x) \delta x_j^2 + \ldots$$ (43)

By using the calculation point used for obtaining $f_{iii}(X)$, an accuracy of $f_{ii}(X)$ can be improved.

Defining the finite differential $\delta^*_{ii}$ as the following formula 44, developing the same and arranging for $f_{ii}(X)$, the following formula 45 can be obtained.

$$\begin{aligned}\delta_i f &= \frac{1}{2}(f(\ldots, x_i + \delta x_i, \ldots) - f(\ldots, x_i - \delta x_i, \ldots)) - \\ &\quad \frac{1}{3!} \delta_{iii} f \\ &= f_i(x) \delta x_i - \frac{9}{5!} f_{iiiii} \delta x_i^5 + \ldots\end{aligned}$$ (44)

$$f_i(x) = \frac{\delta_i f}{\delta x_i} - \frac{9}{5!} f_{iiiii} \delta x_i^4 + \ldots$$ (45)

Compared the formula 45 with the formula 39, the lowest order in the residual term of the formula 45 is higher than that of the formula 39, the accuracy of the approximation of the formula 45 is higher than that of the formula 39.

By employing the calculation point used for obtaining $f_{iii}(X)$, higher accuracy of the approximation of $f_i(X)$ can be obtained. The formula 33 expressed $f_i(X)$ in a form of the finite differential contains $f_{iii}(X)$. To eliminate the term of $f_{iii}(X)$, defining the finite differential $\delta^0_i$ by the following formula 46, developing the same, arranging for $f_i(X)$, the following formula 47 can be obtained.

$$\begin{aligned}\delta_i f &= \frac{1}{2}(f(\ldots, x_i + \delta x_i, \ldots) - f(\ldots, x_i - \delta x_i, \ldots)) - \\ &\quad \frac{1}{3!} \delta_{iii} f \\ &= f_i(x) \delta x_i - \frac{9}{5!} f_{iiiii} \delta x_i^5 + \ldots\end{aligned}$$ (46)

$$f_i(x) = \frac{\delta_i f}{\delta x_i} - \frac{9}{5!} f_{iiiii} \delta x_i^4 + \ldots$$ (47)

Compared the formula 47 with the formula 3, the lowest order of the residual term of the formula 47 is higher than that of the formula 33 by a second order, the approximation of the formula 47 is more accurate than that of the formula 34.

By using the resultant $f_{iii}(X)$, $f_{iij}(X)$, highly approximated $f_i(X)$ and $f_{ii}(X)$, and $f_{ij}(X)$ obtained in the fourth embodiment, all of fourth order moments in the formulas 22 to 28 can be expressed by the finite differentials.

In the embodiment, the calculation points for calculating the finite differentials are $(X_1, X_2, \ldots, X_n)$, $(\ldots, X_i+2\delta x_i, \ldots)$, $(\ldots, X_i+\delta x_i, \ldots)$, $(\ldots, X_i-\delta x_i, \ldots)$, $(\ldots, X_i-2\delta x_i, \ldots)$, $(\ldots, X_i+\delta x_i, X_j+\delta x_j, \ldots)$, $(\ldots, X_i+\delta x_i, X_j-\delta x_j, \ldots)$, $(\ldots, X_i-\delta x_i, X_j+\delta x_j, \ldots)$, $(\ldots, X_i-\delta x_i, X_j-\delta x_j, \ldots)$. The number of the calculation required for n piece of parameters is $4 \times n(n-1)/2 + 4n + 1 = 2n^2 + 2n + 1$. The fifth embodiment shows a high accuracy approximation but needs a long processing time.

The configuration of a simulator of the fifth embodiment and the operation thereof are similar to those of the fourth embodiment. There are a plurality of the finite differentials in the fifth embodiment, and thus a means for monitoring and judging the finite differentials, such as the CPU, should be provided as similar to the fourth embodiment.

Specific examples will be described.

EXAMPLE 4

Example 4 is an example where the member of the parameter of the third embodiment is one and an actual calculation is performed. In Example 4, the simulation of the threshold value $V_{th}$ is performed by varying the thickness of a poly-silicon as a date electrode.

Table 7 shows a display example displayed on the output and display unit 10A of FIG. 6, at the input and setting of STEP 11 of FIG. 7.

TABLE 7

| . . .<br>DEPO MATERIAL = POLYSI THICK = 3.5<br>STDDEVI = 3.5<br>. . . | ← $X_{c1}$, $V_1$ |
|---|---|

Here, "MATERIAL=POLYSI THICK=3.5" indicates that a film of the poly-silicon is formed at the distribution center value=3.5 µm. "STDDEVI=0.3" means that the thickness of the film during the film formation can be varied at the standard deviation of 0.3. The distribution center value $Xc_1$ and the standard deviation $\delta_1$ are given by manual or from the parameter memory 12A in FIG. 6.

The output setting unit 18 reads the formula Vth(x) of the threshold voltage as the physical formula f(x) from the physical memory 16A and inputs the same to the characteristic calculation unit 4A.

At STEP 12, the sampling for the evaluation points is performed. In this example, considering the description for the standard deviation $\delta_1$ in Table 5, the sampling is carried out for two points $X_{1H}$ and $X_{1L}$ which are separated from the distribution center value $Xc_1$ by ±10%. The results are shown in Table 8.

TABLE 8

| . . .<br>DEPO MATERIAL = POLYSI THICK = 3.85<br>• . . . | ← $X_{1H}$ |
|---|---|
| . . .<br>DEPO MATERIAL = POLYSI THICK = 3.15<br>. . . | ← $X_{1L}$ |

The determination of the sampling is not limited to the above example, and can be done by experimental basis or any other methods. The distribution rate (ratio) can be expressed by in any form.

At STEP 13, the characteristic calculation for the two points $X_{1H}$ and $X_{1L}$ was performed. Namely, $V_{th}(+)=V_{th}(X_{1H})$ and $V_{th}(-)=V_{th}(X_{1L})$ were calculated by using the formula $V_{th}(x)$ of the threshold voltage.

At STEP 14, the following distribution approximation term $N_i$ was calculated by the formula 55.

$$N_1 = [\tfrac{1}{2}(V_{th}(+)-V_{th}(-))/(X_{c1} \times 0.1)]^2 \times \delta_1^2$$

In Example 4, the parameter is one, and thus, the above formula, per se, represents the variance.

At STEP 15, the standard deviation $\delta V_{th}$ of the threshold voltage $V_{th}$ was calculated and output.

EXAMPLE 5

Example 5 is an example where the parameters are plural. The following parameters were adapted:
a first parameter $X_1$: the gate length (the distribution center value=0.1 µm the standard deviation=0.08)
a second parameter $X_2$: dose quantity at ion injection (the distribution center value=$1.5 \times 10^{15}$/cm$^2$, the standard deviation=$1.5 \times 10^{15}$)

The value of the parameters $X_1$ and $X_2$ were varied and the simulation of the threshold voltage was performed.

At STEP 12, the selection of the sampling points $X_{1H}$ and $X_{1L}$ of the gate length and the sampling points $X_{2H}$ and $X_{2L}$ of the dose quantity were done.

At STEP 13, the characteristic calculation was performed for the four points. Table 6 shows the results.

TABLE 9

| GATE LENGTH (µm) | DOSE QUANTITY (/cm$^2$) | Vth (V) | |
|---|---|---|---|
| 1.1 | 1.5 E15 | 0.41 | ← $V_{th}$ ($X_{1H}$) |
| 0.9 | 1.5 E15 | 0.38 | ← $V_{th}$ ($X_{1L}$) |
| 1.0 | 1.65 E15 | 0.40 | ← $V_{th}$ ($X_{2H}$) |
| 1.0 | 1.35 E15 | 0.39 | ← $V_{th}$ ($X_{2L}$) |

At STEP 14, the distribution approximation term $N_1$ when the gate length is varied, and the distribution approximation terms $N_2$ when the dose quantity is varied, were calculated as follows:

$$N_1 = [1/2(0.41 - 0.38)/(3.5 \times 0.1)]^2 \times 0.08^2$$
$$= 0.00069$$
$$N_2 = [1/2(0.4 - 0.39)/(1.5 \times 10^{14})]^2 \times (1 \times 10^{14})^2$$
$$= 0.00222$$

At STEP 15, the standard deviation $\delta V_{th}$ of the threshold voltage $V_{th}$ was calculated and output.

$$\sigma V_{th} = \sqrt{0.00096 + 0.00222} = 0.0312$$

PROCESSING TIME

In the conventional simulation, the actual processing time consists of the time for data setting from the generated random number (20 minutes) and the time for calculation, approximately 60 minutes, for each characteristic calculation point. When the number of the characteristic calculation points is 1000, even the number of the parameter is one, the total processing time become 8000 minutes (approximately 133 hours).

In the third embodiment of the present invention, the characteristic calculation points were reduced to four, and the input data were automatically generated and thus the data setting time is negligible; consequently, the total processing time was greatly shortened to 240 minutes (four hours).

The present invention can be modified.

Also, the present invention can be applied to a variety of simulations of the semiconductor circuits.

In the above description, the simulator and the simulation method were described, apparently, the simulation method can be programmed as a software and can be operated in the simulator. Such software can be stored in a recording medium.

According to the present invention, it can adapt not only a normal distribution but also any profile of distribution.

According to the present invention, an accuracy of an approximation is improved.

Further, according to the present invention, a simulation time is greatly shortened.

What is claimed is:

1. A simulation apparatus for simulating a characteristic of a semiconductor circuit, comprising:

a distribution information input means for receiving distribution information, wherein the distribution information includes a distribution profile of a variation of a device parameter or a process parameter of the semiconductor circuit and is adaptive to an actual distribution and wherein said distribution information input means can receive distribution information having both Gaussian and non-Gaussian distribution profiles;

a random number generating means for generating a random number on the basis of a probability corresponding to the distribution profile of the distribution information received by the distribution information input means;

a characteristic calculation means for calculating a dominant formula by using the random number to obtain a characteristic of the semiconductor circuit; and an output means for outputting the resultant characteristic of the semiconductor circuit.

2. A simulation apparatus according to claim 1, wherein the distribution profile of the distribution information is expressed by a numerical data series or a histogram.

3. A simulation apparatus according to claim 1, wherein said simulation apparatus comprises a digital computer.

4. A method of simulating a characteristic of a semiconductor circuit, including the steps of:

receiving distribution information, wherein the distribution information includes a distribution profile of a variation of a device parameter or a process parameter of the semiconductor circuit and is adaptive to an actual distribution and wherein said distribution information can have both Gaussian and non-Gaussian distribution profiles;

generating a random number on the basis of a probability corresponding to the distribution profile of the distribution information received in the receiving step;

calculating a dominant formula by using the random number to obtain a characteristic of the semiconductor circuit; and outputting the resultant characteristic of the semiconductor circuit.

5. A method according to claim 4, wherein the distribution profile of the distribution information is expressed by a numerical data series or a histogram.

6. A method according to claim 4, wherein the step of generating of the random number is carried out by a Monte Carlo method.

7. A simulation apparatus for simulating a characteristic of a semiconductor circuit, comprising:

a distribution information input means for receiving distribution information, the distribution information including a profile, center and deviance of a distribution of a parameter variation of the semiconductor circuit, wherein the parameter variation corresponds to at least a device parameter or process parameter;

a sampling means for sampling two points corresponding to each parameter, the two points being either a center point of the distribution and a point that is on the profile and spaced apart from the center point by a distance defined by a predetermined distribution ratio or two points that are on the profile, one on each side of the center point, and spaced apart from the center point by distances defined by a predetermined distribution ratio;

a characteristic calculation means for calculating a dominant formula of the semiconductor circuit at the two sampled points to obtain two characteristics of the semiconductor circuit at the two points;

a distribution approximation term calculation means for calculating an approximation term and deriving via a moment development approach a formula expressing the characteristic of the semiconductor circuit, wherein the formula is expressed as an average of powers of a value corresponding to the characteristic to be obtained;

a distribution characteristic calculation means for calculating a variance or standard deviation of the characteristic of the semiconductor circuit over a full range of the parameter by using the approximation term from the distribution approximation term calculating means; and an output means for outputting the result of the distribution characteristic calculations.

8. A simulation method for simulating a characteristic of a semiconductor circuit, including the steps of:

receiving distribution information, the distribution information including a profile, center and deviance of a distribution of a parameter variation of the semiconductor circuit, wherein the parameter variation corresponds to at least a device parameter or process parameter:

sampling two points corresponding to each parameter, the two points being either a center point of the distribution and a point that is on the profile and spaced apart from the center point by a distance defined by a predetermined distribution ratio or two points that are on the profile, one on each side of the center point, and spaced apart from the center point by distances defined by a predetermined distribution ratio;

calculating a dominant formula of the semiconductor circuit at the two sampled points to obtain two characteristics of the semiconductor circuit at the two points;

calculating an approximation term and deriving via a moment development approach a formula expressing the characteristic of the semiconductor circuit, wherein the formula is expressed as an average of powers of a value corresponding to the characteristic to be obtained;

calculating a variance or standard deviation of the characteristic of the semiconductor circuit over a full range of the parameter by using the calculated approximation term; and outputting the result of the distribution characteristic calculation.

9. A recording medium storing software for simulating a characteristic of a semiconductor circuit, including the steps of:

receiving a distribution information, wherein the distribution information includes a distribution profile of a variation of a device parameter or a process parameter of the semiconductor circuit and is adaptive to an actual distribution and wherein said distribution information can have both Gaussian and non-Gaussian distribution profiles;

generating a random number on the basis of a probability corresponding to the distribution profile of the distribution information received;

calculating a dominant formula by using the random number to obtain a characteristic of the semiconductor circuit and outputting the resultant characteristic of the semiconductor circuit; and outputting the resultant characteristic of the semiconductor circuit.

10. The recording medium of claim 9, wherein the distribution profile of the distribution information is expressed by a numerical data series or a histogram.

11. The recording medium of claim 9, wherein the generating of the random number is carried out by a Monte Carlo method.

12. A recording medium storing software for simulating a characteristic of a semiconductor circuit, including the steps of:

receiving distribution information, the distribution information including a profile, center and deviance of a distribution of a parameter variation of the semiconductor circuit, wherein the parameter variation corresponds to at least a device parameter and/or process parameter;

sampling two points corresponding to each parameter, the two points being either a center point of the distribution and a point that is on the profile and spaced apart from the center point by a distance defined by a predetermined distribution ratio or two points that are on the profile, one on each side of the center point, and spaced apart from the center point by distances defined by a predetermined distribution ratio;

calculating a dominant formula of the semiconductor circuit at the two sampled points to obtain two characteristics of the semiconductor circuit at the two points;

calculating an approximation term and deriving via a moment development approach a formula expressing the characteristic of the semiconductor circuit, wherein the formula is expressed as an average of powers of a value corresponding to the characteristic to be obtained;

calculating a variance and/or standard deviation of the characteristic of the semiconductor circuit over a full range of the parameter by using the approximation term from the approximation term calculating step; and outputting the result of the distribution characteristic calculation.

\* \* \* \* \*